(12) United States Patent
Mehnert et al.

(10) Patent No.: US 10,703,508 B1
(45) Date of Patent: Jul. 7, 2020

(54) STEREOSCOPIC FLIGHT SIMULATOR WITH DATA ACQUISITION

(71) Applicant: Amazon Technologies, Inc., Seattle, WA (US)

(72) Inventors: Herbert Mehnert, Seattle, WA (US); Benjamin Griffin Novak, Seattle, WA (US); Barry James O'Brien, Seattle, WA (US); Jason Leonard Peacock, Bellevue, WA (US)

(73) Assignee: Amazon Technologies, Inc., Seattle, WA (US)

( * ) Notice: Subject to any disclaimer, the term of this patent is extended or adjusted under 35 U.S.C. 154(b) by 926 days.

(21) Appl. No.: 15/252,774

(22) Filed: Aug. 31, 2016

(51) Int. Cl.
```
G09B 9/24       (2006.01)
B64F 5/00       (2017.01)
B64C 39/02      (2006.01)
B64D 47/08      (2006.01)
G06F 30/20      (2020.01)
```
(52) U.S. Cl.
CPC .......... *B64F 5/0045* (2013.01); *B64C 39/024* (2013.01); *B64D 47/08* (2013.01); *G06F 30/20* (2020.01); *G09B 9/24* (2013.01)

(58) Field of Classification Search
None
See application file for complete search history.

(56) References Cited

U.S. PATENT DOCUMENTS

2019/0371195 A1\* 12/2019 Walker ................... G06N 20/00

\* cited by examiner

*Primary Examiner* — James B Hull
(74) *Attorney, Agent, or Firm* — Lee & Hayes, P.C.

(57) ABSTRACT

Systems, apparatuses, and methods provide simulations to vehicles, such as unmanned aerial vehicles (UAVs) equipped with stereoscopic cameras. The system can include a plurality of screens set at predetermined angles to provide proper parallax to the stereoscopic cameras. The system can also include a test computer to update the screens based on the actions and travel time of the UAV. The test computer can also monitor the load on the computing systems of the UAV due to the camera and other inputs. The system can enable the testing and configuration of cameras and sensors without requiring actual flight. The test computer can provide navigational information to the UAV, receive actions taken by the UAV, update the screens based on these actions and the travel speed and direction of the UAV, and monitor the effects of the cameras and other sensors on the internal components of the UAV during use.

15 Claims, 10 Drawing Sheets

Fig. 2
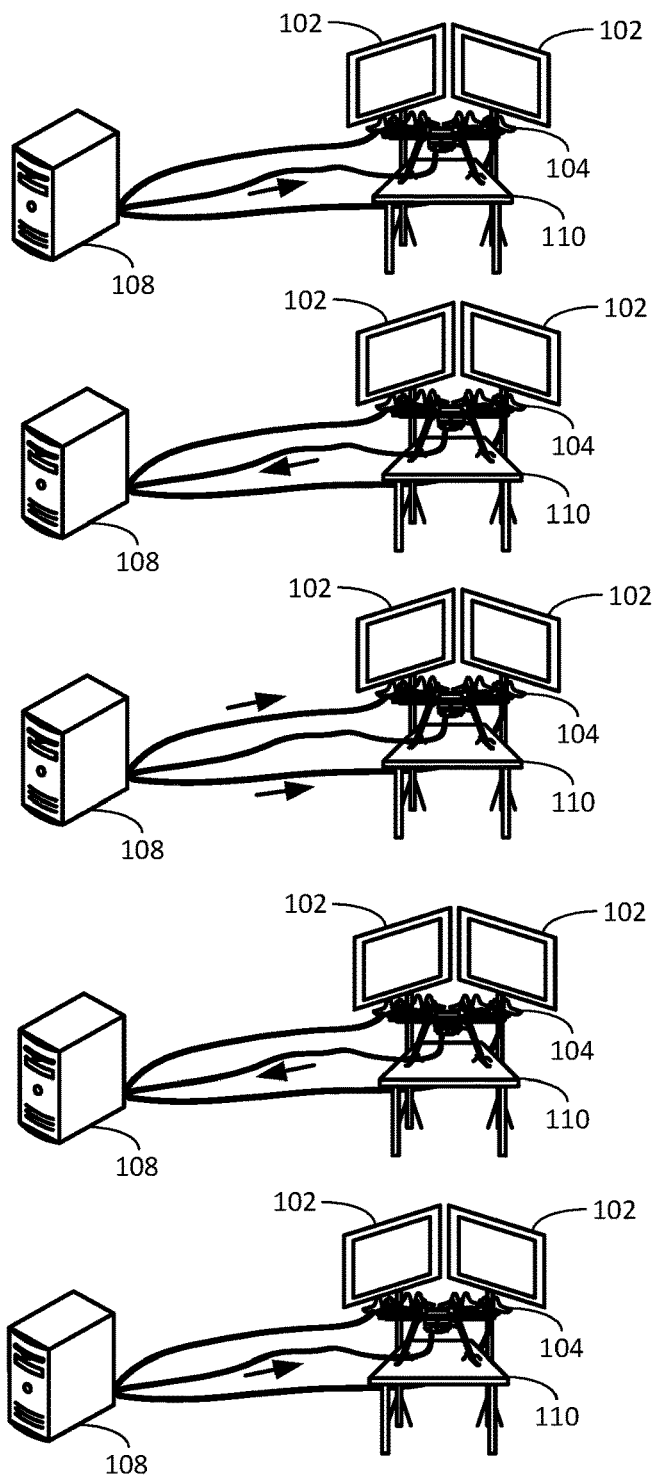
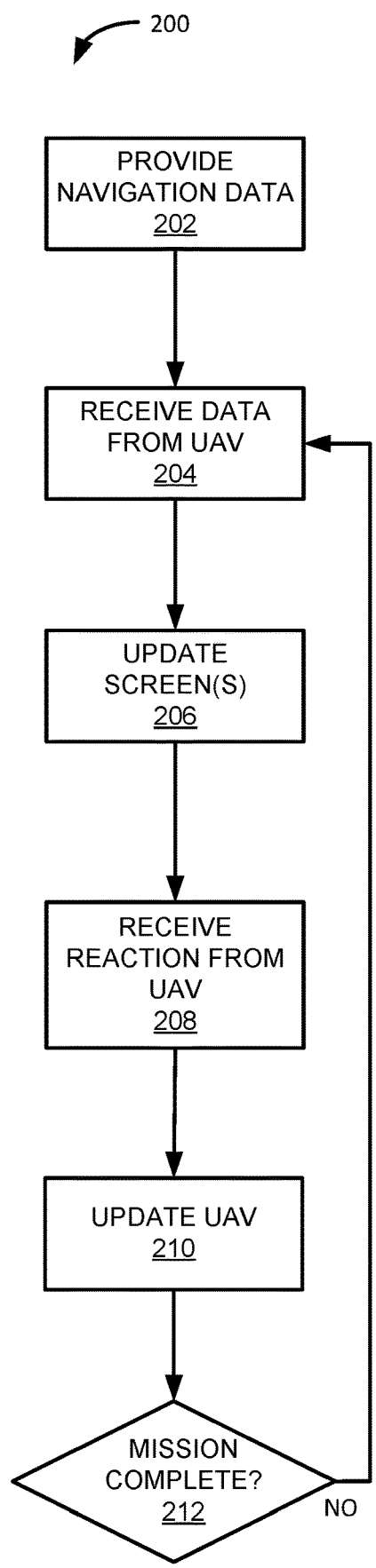

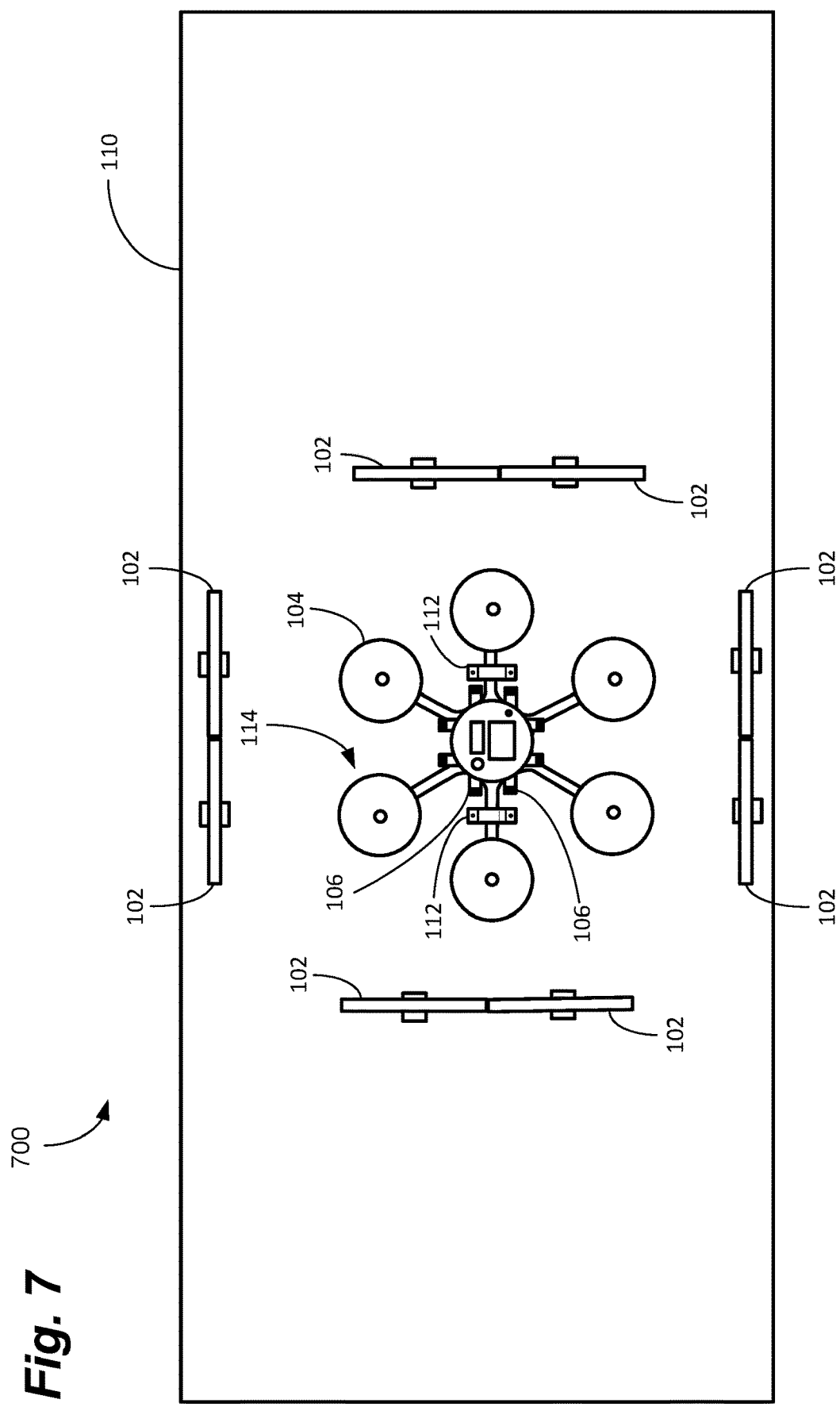

STEREOSCOPIC FLIGHT SIMULATOR WITH DATA ACQUISITION

BACKGROUND

Unmanned aerial vehicles (UAVs), along with robots and other autonomous objects, are being used to perform tasks that were previously performed by people. For example, a UAV may deliver a package to a residence instead of a courier delivering the package. As the number of UAVs used for various purposes increases, and their use become more widespread, increasingly sophisticated UAVs may be used to provide additional functionality.

More sophisticated instrumentation and navigation may provide additional features to enable more accurate delivery and better collision avoidance, among other things. Stereoscopic cameras, for example, can be used to provide imagery and distance calculations for object avoidance and navigation, among other things. These and other components can require increases in processor power, memory, and bandwidth, among other things.

To this end, it can be desirable to test the effects of new equipment on system components in a controlled environment. Using simulations, for example, can enable system performance to be tested with and without new equipment to measure the direct and indirect effects on system hardware and locate any software incompatibilities. Gathering this data in a controlled test is both less expensive and less risky and provides the ability to gather more, and more accurate, data.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

FIG. 2 is a pictorial flowchart depicting a method for closed loop simulation of the UAV, in accordance with some examples of the present disclosure.

FIG. 7 is a schematic diagram that depicts a 360 degree test rig, in accordance with some examples of the present disclosure.

DETAILED DESCRIPTION

Figure 1:
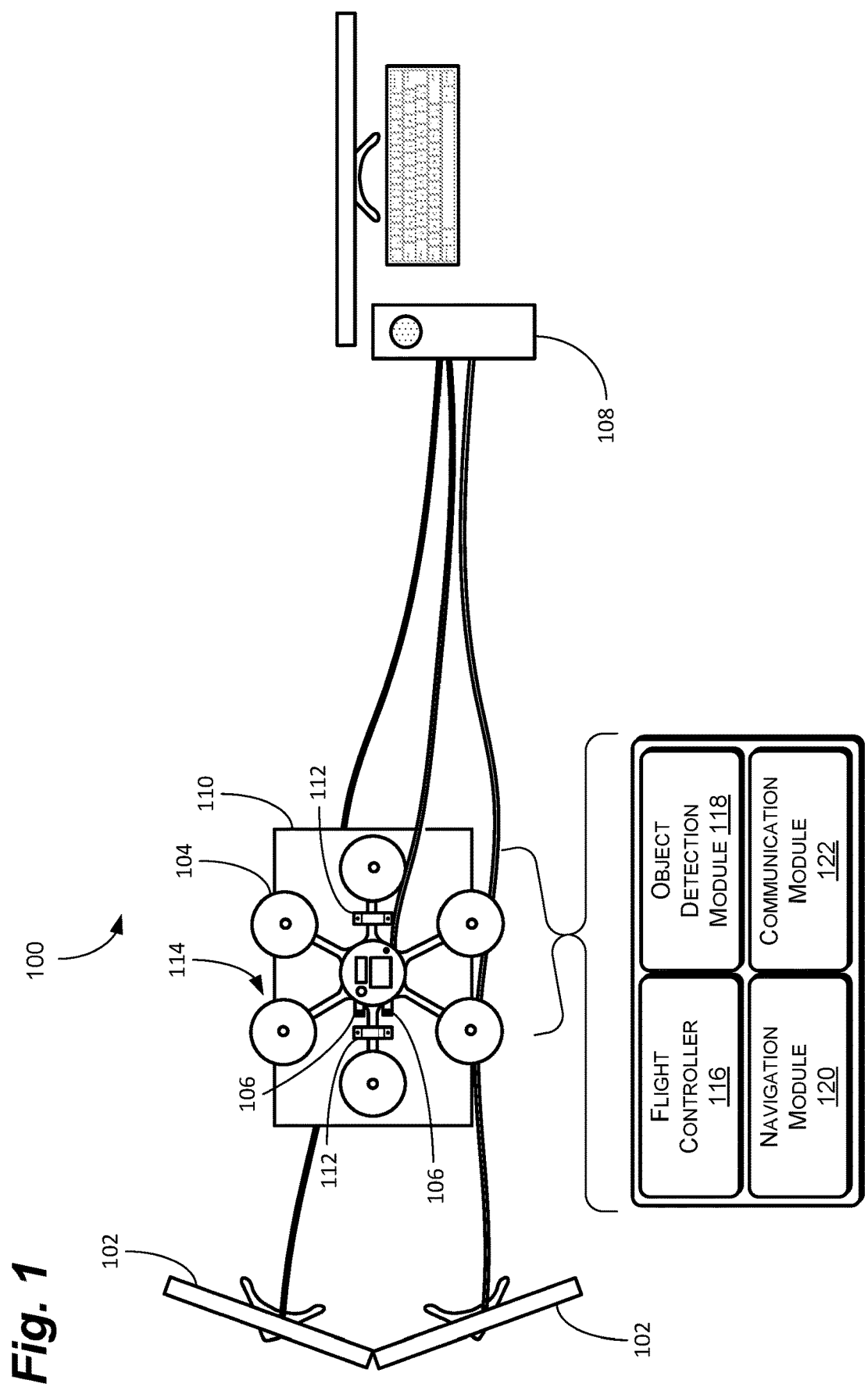
FIG. 1 is a schematic diagram that depicts an illustrative test environment that includes an unmanned aerial vehicle (UAV), in accordance with some examples of the present disclosure.

Examples of the present disclosure are related to systems for testing vehicles, and particularly, unmanned aerial vehicles (UAVs) in a static environment. The system can include a plurality of video screens, or displays, set at predetermined distances and angles to provide an accurate simulation for UAVs with multiple sensors. In some examples, the system can depict images, including an accurate parallax angle, to simulate a 3-D environment for UAVs with depth sensing sensors such as, for example, stereoscopic cameras. The system can enable the accurate testing of the effect of new sensors and other equipment on UAV systems (e.g., processor and memory usage statistics) in flight, without requiring actual flight. This can reduce the time and expense required to assess new equipment by eliminating test flights and the costs associated therewith (e.g., fuel, weather, in-flight damage, wear and tear, etc.). This can also enable specific scenarios to be tested repeatedly to isolate problems and eliminate test anomalies.

As in many testing scenarios, the observer effect states that the act of observing a situation will, in itself, change the situation. This can be particularly true when it comes to testing and data logging in the computing world. If a new camera is added to a UAV, for example, and then the UAV is test flown outside, the actual effect of the new camera on the processor, memory, and other components of the UAV can be difficult to determine. This is because the camera is causing a change in resource allocation, but the data logging software is also causing some of this change. Thus, it can be difficult to pinpoint the exact cause of a change in processor utilization, for example, or other components.

In addition, because the processor, memory, and communication busses on the UAV process data at a finite rate, the impact of new equipment on the system may be difficult to measure because of a "bottleneck." In other words, if a new piece of equipment is added and the processor becomes overloaded, this does not necessarily mean that the processor is the bottleneck. Instead, the processor could be overloaded as it tries to manage an overloaded communications bus or memory, for example. As a result, external measurement of these resources may be advantageous.

Thus, it can be useful to be able to connect directly to the UAV during test flights to monitor system parameters. Due to bandwidth limitations for wireless connections, for example, this may be more easily achieved with high-speed wired communications (e.g., Ethernet or Firewire) than with wireless communications (e.g., Bluetooth® or 802.11x). Obviously, this is difficult to achieve on a UAV that is actually in flight. Indeed, even if this were possible, the wired communications would not only affect the flight range, but also the flight characteristics due to the weight of the cabling.

In addition, flying a UAV with new equipment can produce unexpected results. If the new equipment (e.g., a stereoscopic camera) utilizes an excessive amount of the UAV's processing power, for example, the UAV may not have the necessary remaining processing power to maintain steady flight and navigate as intended. This may result in crashes, lost UAVs, and other unintended consequences. In this manner, it can be advantageous to test new equipment in a static environment using an accurate simulation prior to actual flight testing. In this manner, performance issues can be resolved in a controlled environment with little or no risk to the UAV.

In addition, using accurate stereoscopic, or 3D, simulations can enable the testing and verification of equipment prior to use. In other words, stereoscopic cameras and imaging software can be verified using standardized simulations for calibration. As discussed below, the simulations can be configured to produce a known result from the test equipment, for example, to verify that the equipment is functioning properly.

The techniques, markers, and systems described herein may be implemented in a number of ways. Example implementations are provided below with reference to the following figures.

FIG. 1 is a schematic diagram of an illustrative test environment 100 for accurately testing and configuring UAVs, and other vehicles, without flying or driving the vehicles. The test environment 100 can include a plurality of screens 102 to provide visual feedback to the vehicle. As discussed below, in some examples, the screens 102 can be arranged to provide accurate still or moving images to one or more sensors on the vehicle. In some examples, the images can include, for example, a calculated parallax angle, focal distance, focal length, and/or resolution to make the UAV "think" it is actually flying or make a vehicle "think" that is actually driving.

The test environment 100 can also include a UAV 104, or other vehicle, equipped with one or more sensors, processors, and other equipment to enable the UAV 104 to fly autonomously to and from delivery locations. In some examples, the UAV 104 can include stereoscopic cameras 106 to enable the UAV 104 to provide visual and navigational data to the UAV 104. In some examples, the cameras 106 can also enable the UAV 104 to determine distances to objects in the field of view using parallax calculations, among other things. As discussed below, the screens 102 can also be used to display stereoscopic images to verify camera 106 calibration and provide accurate flight simulations.

The test environment 100 can also include a test computer 108. The test computer 108 can provide accurate images to the screens 102 for the UAV 104 and can be in communication with the UAV 104 for at least two purposes: (1) to send and receive flight data to/from the UAV 104 and (2) to monitor system performance on the UAV 104. This can enable the test computer 108 to provide accurate flight simulations to the UAV 104, while minimizing the effects of external monitoring on the UAV's 104 systems.

To provide accurate simulations, the test computer 108 can provide images to the screens 102 including departure and destination scenes. The test computer 108 can also update the images on the screens 102 according to actions taken by the UAV 104 and due to general travel speed and direction during flight simulation. In other words, as the UAV 104 may perform controls that would cause it to turn right, even though it may actually be fixed in place in the simulation. The test computer 108 can display a corresponding change in what is displayed in the screens 102 to create the visual effect of the UAV 104 turning right even though the UAV 104 may be fixed in place. In addition, even absent changes to the control settings by the UAV 104, the screens 102 can be updated to reflect steady-state flight based on the current velocity and travel direction of the UAV 104.

The test computer 108 can be in communication with the UAV 104 to provide inputs to the UAV 104 (e.g., navigational information and other information for simulations) and receive outputs from the UAV 104 (e.g., flight control surfaces, power settings, etc.). The test computer 108 can also be in communication with the screens 102 and can provide inputs to change the screens 102 in response to actions taken by the UAV 104, or in response to steady-state travel, during a simulation.

The test computer 108 can include a simulated world configured for the UAV 104. The simulated world can include configuration files for the UAV 104 (or multiple UAVs and other vehicles) including, for example, flight characteristics, weights, balances, control inputs, power settings, and navigation settings for the UAV 104. Thus, during a simulation, if a UAV 104 assumes a particular power setting, the test computer 108 can accurately replicate through simulation the corresponding rate of climb that the UAV 104 would achieve in the "real world." If the UAV 104 executes an emergency evasive maneuver during a simulation, on the other hand, the test computer 108 can simulate an accurate rate of turn, climb, or acceleration, for example. Similarly, if a UAV 104 assumes an attitude and power setting that would normally cause the UAV 104 to travel east at 10 mph, this steady-state travel can also be simulated.

The test computer 108 can also monitor the processor, memory, communication bus, and other system usage statistics on the UAV 104 during the simulation. This reduces the observer effect on the UAV 104 because the test computer 108 is running the logging software and not the UAV 104. Indeed, the information provided to the logging software from the UAV 104 may include "task manager" type data that is already running on the UAV 104. In addition, connecting the test computer 108 to the UAV 104 using a lower overhead communications path (e.g., wired vs. wireless) can also reduce observer effects.

In some examples, the test computer 108 may also utilize completely external methods to determine the utilization rates of various components on the UAV 104 instead of, or in addition to direct measurement via the UAV's 104 task manager. In some examples, the test computer 108 can include empirical data relating the utilization of various components with their temperature. In this manner, the test computer 108 can monitor the temperature of the UAV's 104 processor or memory, for example, using an external probe or laser thermometer. In this manner, additional and/or more accurate utilization data can be collected from the UAV 104, further minimizing the observer effect.

The test environment 100 can also include a test stand 110 to secure the UAV 104 during simulated flight. The test stand 110 can include one or more tethers 112, anchors, or other means to secure the UAV 104 to the test stand 110. The test stand 110 can fix the UAV 104 in place, yet enable the propulsion system 114 to run at normal speeds (e.g., at the speed it would normally run for lift off, flight, and landing). This can enable more accurate testing of power settings, power consumption, battery life, and other parameters related to the propulsion system 114. In some examples, the test environment 100 can include physical or calculated compensation for any recirculation effects caused by, for example, propellers operating in a stationary manner close to the surface (i.e., the recirculation of flow by the propellers as it bounces off the ground can lead to slightly lower power consumption than would occur in normal flight).

The test computer 108 can also provide navigation data to the UAV 104 to simulate an actual flight. In other words, because the UAV 104 is fixed to the test stand 110, the onboard navigation system of the UAV 104 will not register any change in position or attitude. Thus, the test computer 108 can provide this data to the UAV 104 as if it were flying to complete the simulation. This can include changes in Global Positioning System (GPS) location as the UAV 104 "flies" through the simulation. This can also include changes to readings from gyros, or other inertial measurement sensors, to simulate acceleration and roll, pitch, and yaw, among other things.

During a test flight, therefore, the test computer 108 can be in electronic communication with the screens 102 to provide an opening "scene" and to change the images as the UAV 104 moves through the simulation to provide an accurate simulation. The scene can include an accurate image on each the screens 102 with a slightly different perspective for each of the cameras 106. The test computer 108 can also provide initial navigational data (e.g., a starting GPS location). The test computer 108 can also provide navigational data for the destination, such as a simulated delivery location. In some cases, onboard navigational software on the UAV 104 can plot a route from the starting location to the destination. In other examples, the test computer 108 can provide route information to the UAV 104.

As the UAV 104 increases power to the propulsion system 114, for example, the test computer 108 can receive this change in power setting and modify the images on the screens 102 as if the UAV 104 was climbing. As the UAV 104 tilts forward to increase its speed, the test computer 108 can again receive these commanded flight control inputs and can update the screens 102 to simulate an increase in speed. During the simulation, the test computer 108 can insert obstacles (e.g., trees) in the scene, for example, to test the object detection module 118 and the navigation module 120 (discussed below) on the UAV 104.

The test computer 108, UAV 104, and screens 102 can be in electronic communication using, for example, wired or wireless communications. In some examples, these components 102, 104, 108 can be connected using, for example, Ethernet, Firewire, USB, or other cables and suitable network adapters. In other examples, these components 102, 104, 108 can be connected using, for example, cellular, 802.11x, Bluetooth®, or other wireless connections with suitable network adapters.

The UAV 104 may be equipped with a number of components to enable the UAV 104 to perform the delivery of a package or other payload. The UAV 104 can include, for example, a flight controller 116, an object detection module 118, a navigation module 120, and a communication module 122, as well as other components discussed below with reference to FIG. 4.

In normal use, the UAV 104 may travel, under control of the flight controller 116, along a flight path at a predetermined altitude (e.g., 50, 100, or 200 feet) toward a delivery location. The flight controller 116 can be in communication with the propulsion system 114, including any flight control surfaces, and various sensors, to control the flight of the UAV 104. The flight controller 116 may receive inputs from an altimeter, for example, to monitor the altitude of the UAV 104. The flight controller 116 can also be in communication with the navigation module 120, discussed below, to ensure the UAV 104 follows a flight path to the destination.

As the name implies, the object detection module 118 can enable the UAV 104 to avoid collisions with external objects in its flightpath. The object detection module 118 can receive inputs from the cameras 106, for example, and/or various addition sensors to detect object and, in conjunction with the flight controller 116, avoid them. In some examples, the object detection module 118 can calculate the distance to an object using a parallax calculation based on the spacing of the stereoscopic cameras 106. In other examples, the object detection module 118 can receive inputs from ultrasonic or laser range finders, for example, to determine the distance to objects and provide this information to the flight controller 116. In some examples, the object detection module 118 can simply provide data related to the distance and approximate size of the object to the flight controller 116 and the flight controller 116 can determine an appropriate evasive action to avoid the object. In other examples, the object detection module 118 can provide a command including the evasive action to the flight controller 116 (e.g., "turn left 90 degrees at maximum rate of turn.")

The navigation module 120 can enable the UAV 104 to accurately fly from one location to another. The navigation module 120 can receive inputs from one or more sensors including, for example, an altimeter, a GPS receiver, long range navigation receiver (LORAN), cellular location services, or other navigation sensors. In some examples, the navigation module 120 can enable the UAV 104 to fly from the starting location to the destination along a substantially straight flightpath (e.g., "as the crow flies"). In other examples, the navigation module 120 can fly multiple segments from the starting location to the destination to enable the UAV 104 to stop at recharging or refueling stations, for example. In some examples, the navigation module 120 can work in conjunction with the flight controller 116 and the object detection module 118 to recalculate and resume a flightpath after avoiding an obstacle.

The communication module 122 can enable the UAV 104 to communicate with a central control, for example, a customer (e.g., the recipient of a package via a text message or e-mail), and, in the test environment 100, the test computer 108. The communication module 122 can include one or more wireless network adapters and ports including, for example, a cellular, 802.11x, Bluetooth®, or other wireless connection. In other examples, particularly in the test environment 100, the communication module 122 can also include one or more wired network adapters and ports including, for example, Ethernet, Firewire, and/or USB.

As shown in FIG. 2, therefore, examples of the present disclosure can also include a method for simulating and monitoring flights for UAVs 104 and other vehicles. In some examples, the test computer 108 can provide a starting location and a simulated flightpath to the UAV 104 and then provide a visual presentation on the screens 102 in response to actions taken by the UAV 104 to follow the flightpath, including maneuvers and steady-state flight. The test computer 108 can also internally and/or externally monitor processor, memory, bus, propulsion system 114, and other UAV 104 component usage to test the effects of, and calibrate, new equipment on the UAV 104, among other things.

At 202, the test computer 108 can provide navigation information to the UAV 104 regarding a simulated flight. In some examples, as mentioned above, the UAV 104 can include a navigation module 120 with internal navigation software and/or hardware capable of autonomous point-to-point navigation. In this case, the navigation data may include only a starting location and a destination. In other examples, the test computer 108 can also provide a specific flightpath, including waypoints, GPS locations, vectors, or other information. The test computer 108 may also include other relevant navigational information such as, for example, a starting altitude, topographical data, no-fly zones, and docking/recharging stations along the route.

At 204, the test computer 108 can receive a commanded flight control input from the UAV 104 to the propulsion system 114 to power up as if to take-off. In some examples, the test computer 108 can receive this information from the flight controller 116, for example. In other examples, this can be measured externally using strain gauges, or other equipment, located on the test stand 110 or tethers 112. Because the UAV 104 is restrained, the propulsion system 114 is free to spin-up the propellers, with the tethers 112 restraining any motion of the UAV 104.

During flight, the test computer 108 can also receive any commanded flight control inputs for maneuvering executed by the UAV 104 during take-off and flight. This can include increasing or decreasing the power setting of the propulsion system 114 as a whole. This can also include any differential power settings to different motors/propellers in the propulsion system 114 to create roll, pitch, and yaw for maneuvering multi-rotor type UAVs 104. Of course, for fixed wing or helicopter style UAVs 104, this can also include any commanded changes to flight control surfaces (e.g., ailerons), tail rotors, or other controls.

Because the UAV 104 is tethered to the test stand 110, however, the UAV 104 does not move. As a result, it is incumbent on the test computer 108 to provide the necessary visual and electronic feedback to the UAV's cameras 106 to make the UAV 104 "think" it is flying. At 206, therefore, based on the flightpath and inputs from the UAV 104, the test computer 108 can modify the images shown on the screens 102 to simulate flight for the UAV 104. As the UAV 104 "ascends", for example, the test computer 108 can change the perspective of the views shown on the screens 102 accordingly. Similarly, if the UAV 104 executes a turn, or any other maneuver, the test computer 108 can update the screens 102 accordingly.

At 208, the test computer 108 can receive "reactions" from the UAV 104. In other words, as the UAV 104 flies through the simulation, it encounters objects, makes turns, powers up and down to land or take-off and takes other actions in response to the images it sees on the screens 102. To provide an accurate simulation, therefore, the test computer 108 can receive these inputs from the UAV 104 and update the screens 102 accordingly. If the UAV 104 turns right to avoid a tree, for example, the test computer 108 can update the screens 102 accordingly.

At 210, the test computer 108 can also provide "false" inputs to various sensors on the UAV 104. In some examples, as the UAV 104 "travels" through the simulation, the test computer 108 can provide updated GPS location data to the UAV 104 to simulate an actual change in location and update the images on the screens 102 at the same time. Similarly, the test computer 108 can also provide accelerometer, gyro, or other data to the UAV 104 to simulate the motion and acceleration of flight.

At 212, the test computer 108 can determine if the UAV 104 has reached the destination or completed the mission, which may include flying from a location to a destination and then back again (e.g., delivering a package and returning to base). If so, the test computer 108 can monitor the landing sequence, for example, to measure UAV 104 performance during this flight regime. Once the UAV 104 has "landed" the simulation can end or can continue to another destination. If, on the other hand, the UAV 104 has not reached the destination or completed the mission, the method 200 can continue in an iterative way at 204.

Figure 3A:
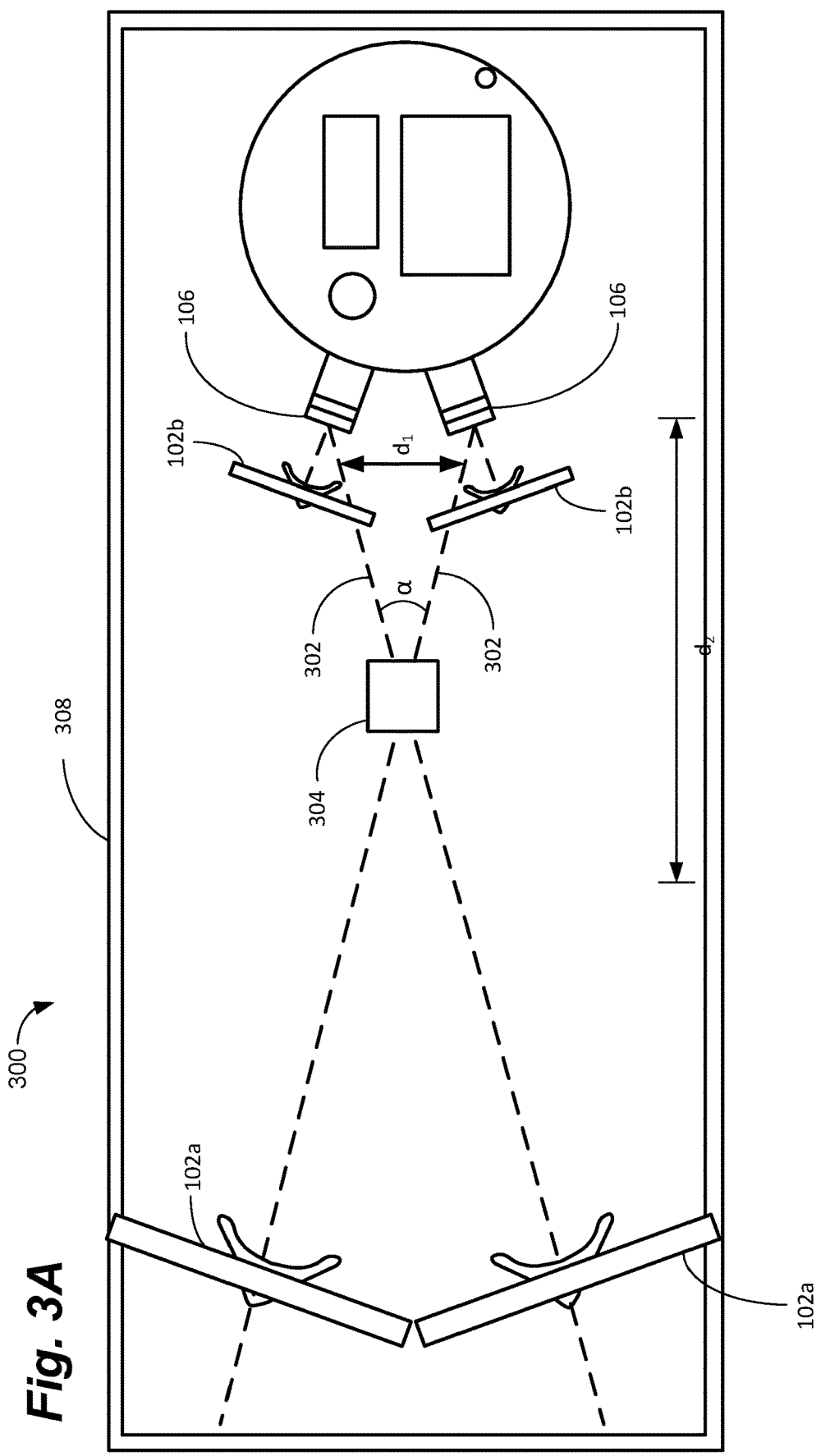
FIGS. 3A-3C depict multiple possible display positions to provide accurate stereoscopic rendering of a simulation for the UAV, in accordance with some examples of the present disclosure.
Figure 3C:
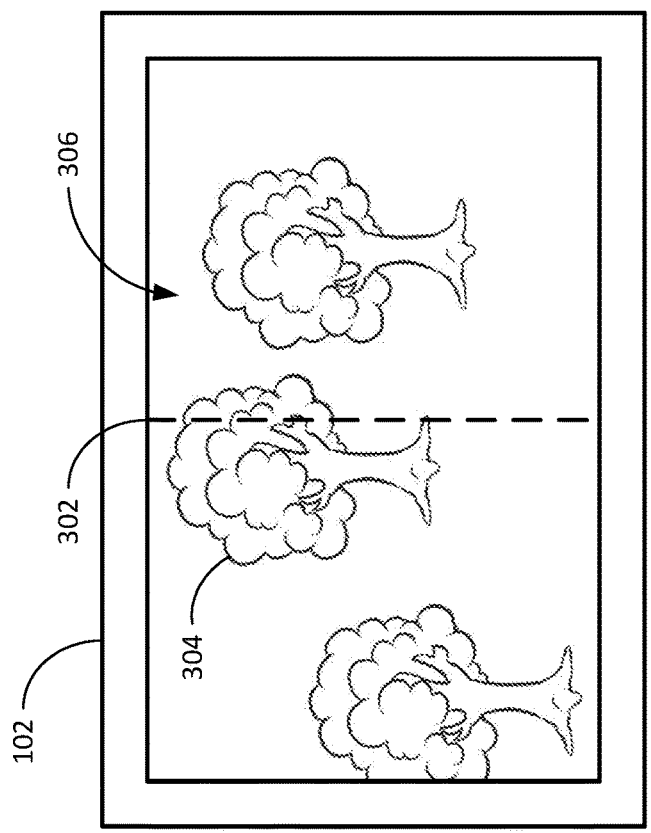
Figure 3B:
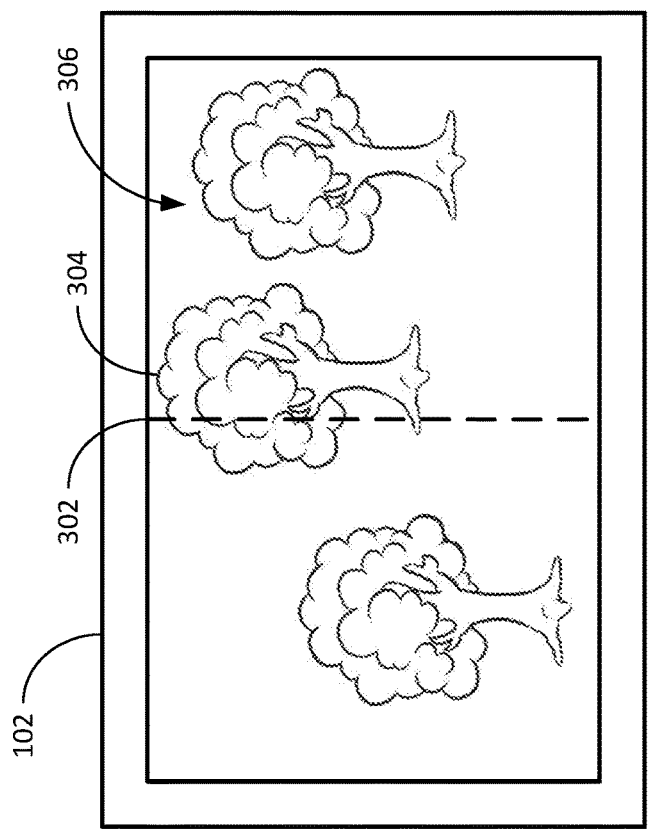

As shown in FIGS. 3A-C, examples of the present disclosure can include a system 300 for providing a realistic view to a pair of stereoscopic cameras 106 on the UAV 104. It can be useful to equip a UAV 104 with two cameras to provide additional inputs and field of view and to improve navigation and obstacle avoidance, among other things. In addition, due to parallax, the use of two (or more) cameras 106 can also be used for distance measurement.

The addition of one or more cameras 106 increases the burden on the electronics of the UAV 104, however, due to the additional bandwidth and processing power required to analyze and utilize the data from the cameras 106. Thus, while high-resolution stereoscopic cameras 106 can improve object detection and avoidance, navigation, and other tasks, the processors, memory, and communications busses on the UAV 104 must be able to handle the inherent increase in data and processor loads, among other things. Thus, it can be useful to test the effects of the cameras 106, or indeed any new sensors, in a static test environment 100 prior to flight testing in the real world.

As shown in FIGS. 3A-3C, because the cameras 106 have slightly different perspectives or viewpoints 302, on a given object 304, the distance to that object 304 can be calculated. In other words, because the distance, $d_1$, between the cameras 106 is relatively small (it has been exaggerated in the figure) and the distance to the object 304 is large, the distance to the object 304 can be calculated using the known distance, $d_1$, between the cameras 106 and a small angle assumption about the parallax angle, $\alpha$, to fairly accurately calculate the distance, $d_2$, to the object 304.

To provide an accurate representation to the cameras 106, therefore, the system 300 can place the screens 102 at an appropriate angle and distance, such that the images on the screens 102 approximate the different perspectives 302 that would be seen by the cameras 106 in the real world. As shown, the screens 102 can be placed in multiple positions. In some examples, the screens 102a can be placed beyond where the object 304 would be seen by the cameras 106. In other examples, the screens 102b can be placed in front of where the object 304 would be in real life and close to the cameras 106. The second option may be preferable as it can provide a wider range of parallax angles, a. In other words, the distant screens 102a can quickly run out of space when objects are simulated close to the UAV 104 (e.g., a causes the views to diverge out of the screen 102a).

As shown, therefore, the screens 102 can be placed at a predetermined distance and angle to provide two slightly different images to the cameras 106 to simulate the stereoscopic view seen by the cameras 106 in the real world. The position and angle of the screens can be a function of the relative position of the cameras to each other (e.g., stereo baseline, straight/toe-in/toe-out), the optics (e.g., focal length, field of view, focusing distance and/or hyperfocal distance), and the image sensor of the cameras. The screens 102 are preferably angled such that they are substantially perpendicular to the cameras 106 to prevent optically distortions from being introduced. Thus, stereoscopic cameras 106 that are "toed-out," for example, would lead to screens that are disposed at an angle to each other, but perpendicular to the cameras 106. See, FIG. 3A. Straight cameras 106, on the other hand, would lead to screens 102 that are parallel to each other and perpendicular to the cameras 106. See, FIG. 7.

Given these variables, the screen 102 preferably occupies the entire field of view of the camera, or as much as possible, and can actually be larger. The screens 102 can be at least as high resolution as the cameras 106, and preferably are higher resolution. The screens 102 should nonetheless be far enough from the cameras 106 that the screen 102 itself falls within the depth of field of the cameras 106. This can be dependent on the focusing distance, among other things. In many cases, the focusing distance can be set to the hyperfocal distance to maximize depth of field while maintaining focus at infinity).[1]

[1] "The hyperfocal distance is the closest distance at which a lens can be focused while keeping objects at infinity acceptably sharp. When the lens is focused at this distance, all objects at distances from half of the hyperfocal distance out to infinity will be acceptably sharp." "Hyperfocal Distance", Wikipedia, available at https://en.wikipedia.org/wiki/Hyperfocal_distance.

As the UAV 104 "flies," therefore, the test computer 108 can update the screens 102 to include obstacles 304, landmarks, and other details displayed at appropriate angles and "distances" to provide a realistic 3-D view for the cameras. Of course, the distance from the cameras 106 to the screens 102 does not actually change. As a result, the apparent distance to various objects 304 in the screens 102 can be varied using the size and angles at which the objects appear (e.g., more distant object appear smaller and grow larger as the UAV "approaches" them.)

In still other embodiments, the screens 102 can be placed very close to the cameras 106, such that they are inside the minimum focusing length of the camera's 106 lens. In this manner, the camera 106 may be forced to focus into the screen 102, rather than on it. In yet other embodiments, the screens 102 can be placed at the hyperfocal distance for the cameras 106. In this manner, the camera 106 is able to focus on the screen 102 and, theoretically, anything inside the screen 102. Depending on the optical configuration, there is some distance closer than the hyperfocal distance that the image in the camera 106 can be considered to be in acceptable focus, and distances out to infinity should also be in acceptable focus. Because the test environment 100 does not necessarily need to focus on the screen 102 itself, however, in theory the screen 102 can be placed closer than the hyperfocal distance (or even the minimum focus distance of the depth of field) and instead rely upon the simulated world displayed on the screen 102 to artificially create the depth and allow for focus "into" the screen 102 at objects in the simulated view. In still other examples, the screens 102 can be placed close to the cameras 106 such that the screens 102 occupy all, or more than, the field of view of the camera 106. In this configuration, it can also be useful for the resolution of the screens 102 to be higher than the resolution of the cameras 106. This can prevent the cameras 106 from focusing on individual pixels, or groups of pixels, in the screen 102 among other things. In this manner, the camera 106 can focus solely on the images 306 in the screens 102 because it cannot see, for example, the edges of the screen 102 or the frame.

As shown in FIG. 3A, to prevent the influence of external light sources on the cameras 106, in some examples, the system 300 can also include an enclosure 308. The enclosure 308 can comprise a simple box or drape to prevent external lights sources from reaching the cameras 106. The enclosure 308 can enclose at least the cameras 106 and screens 102, but may also include other system 300 components (e.g. the test computer 108 or cabling). In some examples, the interior of the enclosure 308 can also include a light absorbing coating to reduce the amount of light reflecting off the inside of the enclosure 308 walls from the cameras 106. To this end, in some examples, the frames of the screens 102 can also include a light absorbing coating or, in the alternative, can be frameless, to reduce or eliminate any reflection off the frame. By substantially limiting the light reflected by the screens 102 and the light provided by external sources, the cameras 106 can more readily focus on the images on the screens 102, rather than the screens 102 themselves. By spacing the screens 102 at a predetermined distance and angle to the cameras 106, the system 300 can also provide a realistic 3D view, including the necessary parallax, to the cameras 106 for accurate test simulations.

In some examples, it can be challenging to get the cameras 106 to focus on the images on the screens 102, rather than the screens 102 themselves. In other words, to simulate the real world, the cameras 106 should focus "into" the screens 102, not on them. To this end, in some examples, the screens 102 can include one or more non-reflective coatings. This can reduce the tendency for incident light to reflect off the screens 102 causing the cameras 106 to focus on the screens 102 rather than the images 306 on the screens 102. In other examples, the front plate glass of the screens 102—i.e., the front glass cover over the display electrodes of the screen 102—can be reduced in thickness or eliminated to prevent reflections.

As shown in FIGS. 3B and 3C, therefore, the system 300 can display slightly different images 306 for each camera 106 to provide an accurate simulation of parallax to the cameras 106. As shown, the viewpoint 302 of each camera 106 is slightly offset providing a 3D perception of the images 306. The system 300 can provide images 306 in which the objects 304, for example, are appropriately offset to create the required parallax for the cameras 106. This can provide a realistic view to the UAV 104 to prevent error messages from the UAV 104 and can also enable any distance measurement or object avoidance software (e.g., the object detection module 118) to function properly. Thus, the object detection module 118 can be tested without actually flying the UAV 104 at an object 304 and risking damage.

In some examples, the system 300 can be used to calibrate the camera 106. In other words, images can be displayed on the screens 102 with a known configuration, such that the distance to one or more objects in the image is known. The cameras 106 can then view the image and a distance can be calculated by the systems on the UAV 104 (e.g., the object detection module 118 or navigation module 120). The cameras 106 and/or systems on the UAV 104 can be adjusted, if necessary, to return the correct distance. Single camera 106 calibration, for example, broadly requires a known target with known features to be displayed to the camera 106. Software can then detect these features and produce a model of the camera's 106 intrinsic parameters (e.g., focal length, distortion, etc.). Stereo calibration extends this by computing the extrinsic parameters that relate two cameras 106 to each other in 3D space. In both cases, a known target can be displayed on the screen 102 to accomplish this task. For single camera 106 calibration, each screen 102 could display the same target, or even display a target moving through 3D space in a simulated world. For stereo camera 106 calibration, each screen 102 can display the same target (static or moving) but with each screen 102 presenting the target view from a slightly different camera 106 orientation. This would simulate the parallax of viewpoints inherent to stereo operations in software, rather than requiring it to exist in the real world.

Figure 4:
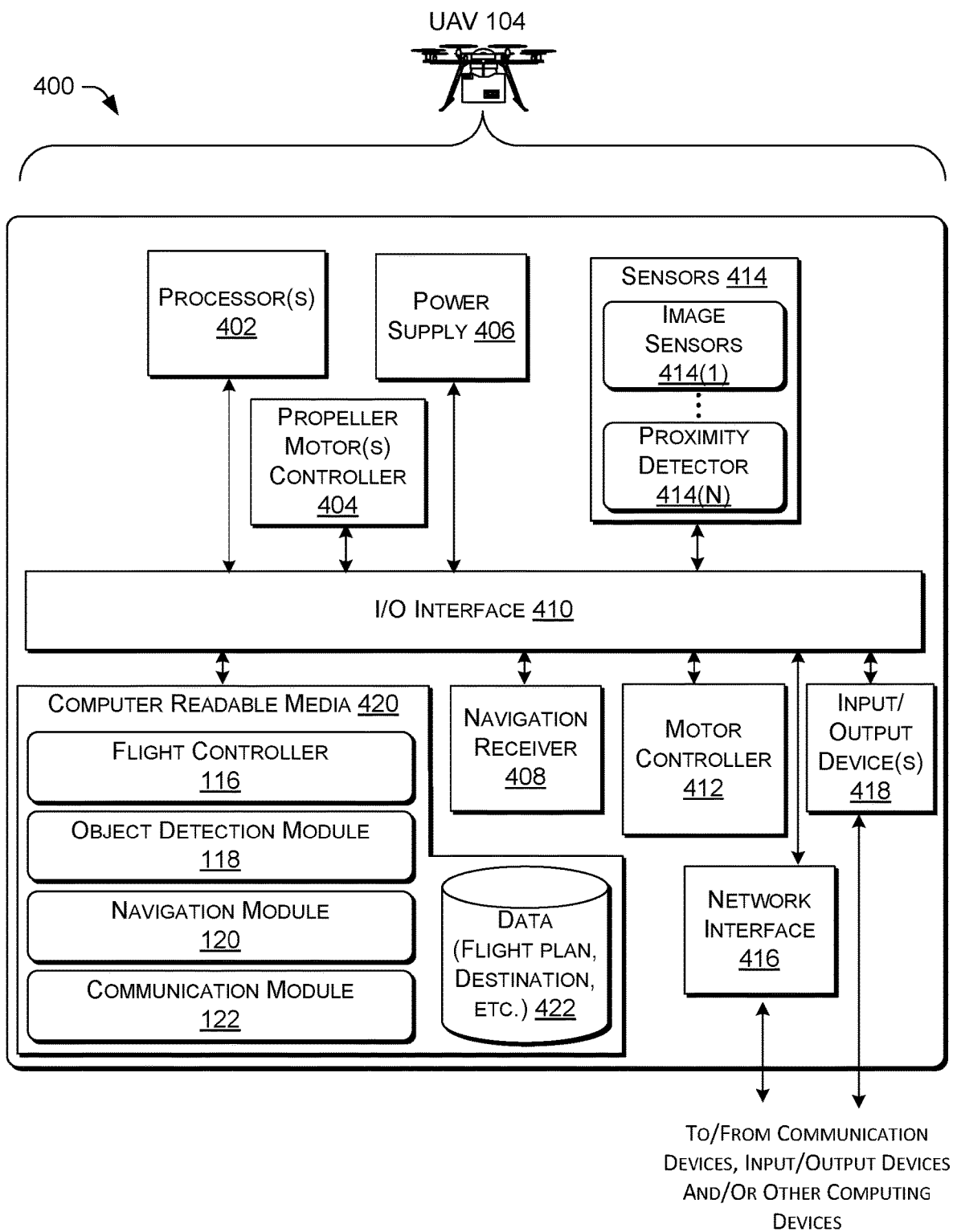
FIG. 4 is a block diagram of the UAV, in accordance with some examples of the present disclosure.

FIG. 4 is a block diagram of an illustrative UAV architecture 400 of the UAV 104. The UAV architecture 400 may be used to implement the various systems, devices, and techniques discussed above. In the illustrated implementation, the UAV architecture 400 includes one or more processors 402, a propeller motor controller 404, power supply module 406, a navigation receiver 408, and an input/output (I/O) interface 410. The UAV architecture 400 can also include a motor controller 412 to interact with a package grapple, for example, sensors 414, a network interface 416, one or more input/output devices 418, and non-transitory computer readable media 420.

In various implementations, the UAV architecture 400 may be implemented using a uniprocessor system including one processor 402, or a multiprocessor system including several processors 402 (e.g., two, four, eight, or another suitable number). The processor(s) 402 may be any suitable processor capable of executing instructions. In various implementations, the processor(s) 402 may be general-purpose or embedded processors implementing any of a variety of instruction set architectures (ISAs), such as the x86, PowerPC, SPARC, or MIPS ISAs, or any other suitable ISA. In multiprocessor systems, each processor(s) 402 may commonly, but not necessarily, implement the same ISA.

The propeller motor controller 404 can communicate with the flight controller 116 and/or navigation module 120 and can adjust the power of each propeller motor to guide the UAV 104 along a determined flight path. The power supply module 406 can control the charging and any switching functions associated with one or more power modules (e.g., batteries) of the UAV 104 to power the motors and other onboard components.

The navigation receiver 408 can include a GPS receiver, cellular receiver, or other similar system that can be used to provide navigation data the UAV 104, and particularly the navigation module 120 to and/or from a location. The motor controller 412 can communicate with an actuator(s) or motor(s) (e.g., a servo motor) used to engage and/or disengage the packages and other cargo. When the UAV 104 arrives at a delivery location, for example, the motor controller 412 can provide an instruction to a motor that controls cargo arms, for example, to release the cargo.

In one implementation, the I/O interface 410 may be configured to coordinate I/O traffic between the processor(s) 402, the non-transitory computer readable media 420, the network interface 416, or other peripheral interfaces, such as input/output devices 418. In some implementations, the I/O interface 410 may perform any necessary protocol, timing, or other data transformations to convert data signals from one component (e.g., the non-transitory computer readable media 420) into a format suitable for use by another component (e.g., the processor(s) 402). In some implementations, the I/O interface 410 may include support for devices attached through various types of peripheral buses, such as a variant of the Peripheral Component Interconnect (PCI) bus standard, for example, or the Universal Serial Bus (USB) standard. In some implementations, the function of the I/O interface 410 may be split into two or more separate components, such as, for example, a north bridge and a south bridge. Also, in some implementations, some or all of the functionality of the I/O interface 410, such as an interface to the non-transitory computer readable media 420, may be incorporated directly into the processor(s) 402.

The sensors 414 may include one or more image sensors 414(1), such as the two cameras 106, a proximity sensor 414(N), and/or other sensors used to detect obstacles 144, locations, bystanders, and/or other items or objects. The network interface 416 can be configured to allow data to be exchanged between the UAV architecture 400 and the test computer 108. The network interface 416 may enable wireless communication between numerous UAVs, for example, or between the UAV 104 and the test computer 108. In various implementations, the network interface 416 may support communication via wireless general data networks, such as a Wi-Fi or Bluetooth® network. In some examples, the network interface 416 may support communication via telecommunications networks such as cellular communication networks, satellite networks, and the like. As mentioned above, the network interface 416 can also include wired communications for efficient communication in the test environment 100, among other things.

The input/output devices 418 may, in some implementations, include accelerometers, altimeters, thermometers, tilt sensors, gyros, and/or other input/output devices commonly used in aviation. Multiple input/output devices 418 may be present and controlled by the UAV architecture 400. One or more of these sensors may be utilized to assist in landings as well as avoiding obstacles during flight.

The non-transitory computer readable media 420 may be configured to store executable instructions/modules, data, flight paths, and/or data items accessible by the processor(s) 402. In various implementations, the non-transitory computer readable media 420 may be implemented using any suitable memory technology, such as static random access memory (SRAM), synchronous dynamic RAM (SDRAM), nonvolatile/Flash-type memory, or any other type of memory. In the illustrated implementation, program instructions and data implementing desired functions, such as those described above, are shown stored within the non-transitory computer readable memory 420. In other implementations, program instructions, data, and/or flight paths may be received, sent, or stored on different types of computer-accessible media, such as non-transitory media, or on similar media separate from the non-transitory computer readable media 420. Generally speaking, a non-transitory, computer readable memory may include storage media or memory media such as flash memory (e.g., solid state memory), magnetic or optical media (e.g., disk) coupled to the UAV architecture 400 via the I/O interface 410. Program instructions and data stored via a non-transitory computer readable medium may be transmitted by transmission media or signals such as electrical, electromagnetic, or digital signals, which may be conveyed via a communication medium such as a network and/or a wireless link, such as may be implemented via the network interface 416.

In some examples, the non-transitory computer readable media 420 may store the flight controller 116, the object detection module 118, the navigation module 120, and the communication module 122. The components may access and/or write data 422, which may include flight plan data, log data, destination data, delivery times, missed deliveries, errors, and so forth. The operation of the flight controller 116, the object detection module 118, the navigation module 120, and the communication module 122 are described above, and also below by way of various illustrative processes.

Figure 5:
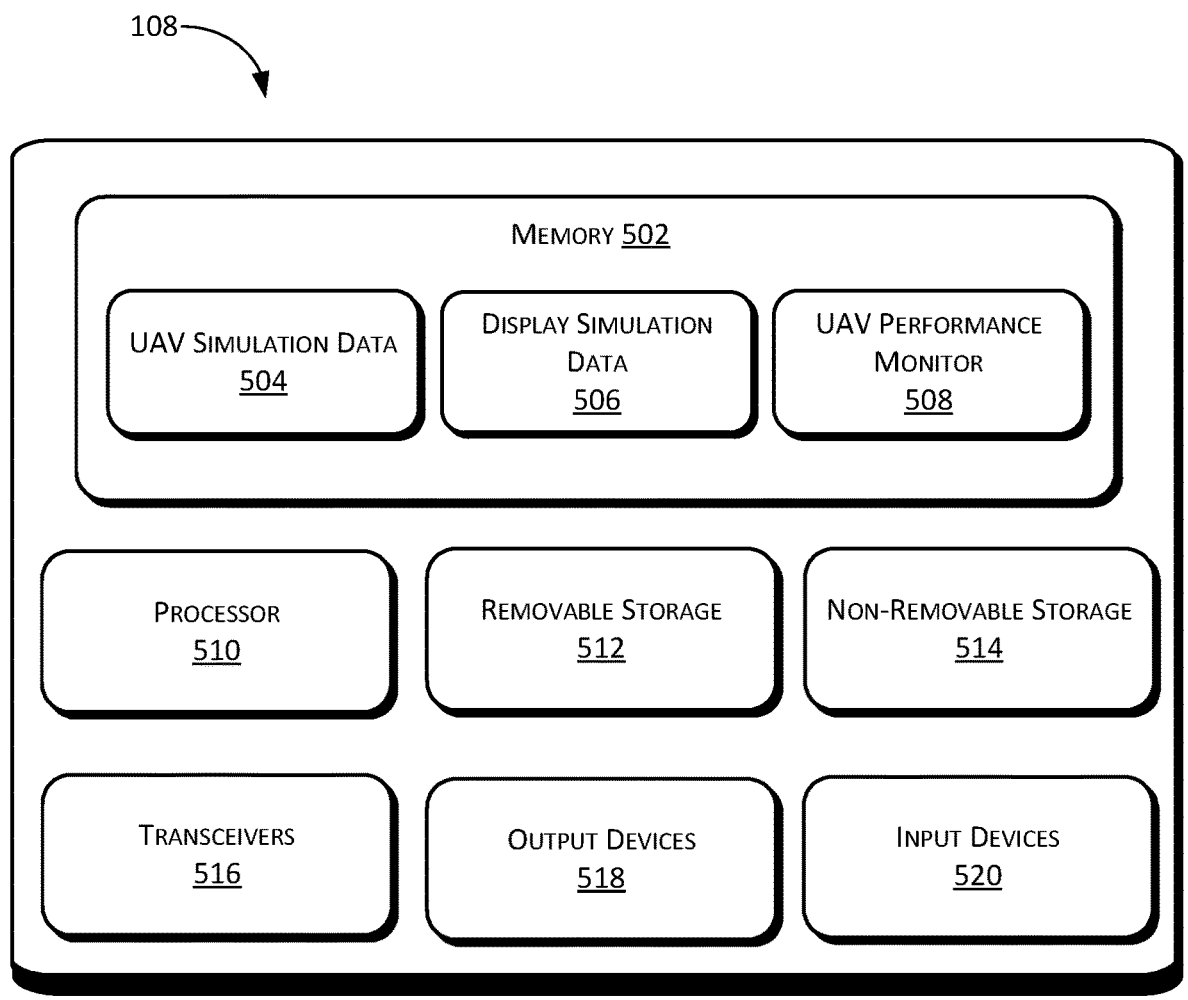
FIG. 5 is a block diagram of a test computer, in accordance with some examples of the present disclosure.

As shown in FIG. 5, the test computer 108 can comprise a number of components to enable it to perform its functions. As discussed below, the test computer 108 can comprise memory 502 configured to include computer-executable instructions including at least UAV simulation data 504, display simulation data 506 and a UAV performance monitor 508. The test computer 108 can also include one or more processor(s) 510, removable storage 512, non-removable storage 514, transceivers 516, output device(s) 518, and input device(s) 520. The test computer 108 may additionally contain a policy engine to receive, create, transmit, and manage the various messages and commands.

In various implementations, the memory 502 can be volatile (such as RAM), non-volatile (such as ROM, flash memory, etc.), or some combination of the two. The memory 502 can also comprise the UAV simulation data 504. As mentioned above, the UAV simulation data 504 can include information related to the specific configuration of the UAV 104 being tested. So, for example, for a multi-rotor copter-type UAV 104, the UAV simulation data 504 can include the number of propellers and motors, weights and balances, power settings, battery capacity and other physical information necessary to create an accurate simulation. The UAV simulation data 504 can also include six degrees-of-freedom simulation data related to measured, or calculated, flight characteristics such as, for example, rates of climb, rates of turn, acceleration and deceleration, and other performance measures. In some examples, the UAV simulation data 504 can also include data received from the UAV 104 at the test computer 108 during flight related to commanded flight control inputs, changes in power, or other settings provided by the flight controller 116 of the UAV 104. In this manner, when the UAV 104 executes a maneuver during a simulation, for example, the test computer 108 can provide an accurate representation to the UAV 104 on the screens 102 and via various outputs 518 (discussed below).

The memory 502 can also include display simulation data 506. The display simulation data 506 can be related to the UAV simulation data 504 in that the test computer 108 can update the screens 102 in response to actions by the UAV 104 based on the UAV simulation data 504. Thus, the display simulation data 506 can include different graphics, or graphic processes, based on the UAV simulation data 504. In this manner, when the UAV 104 initiates a maximum climb maneuver in a simulation, for example, the test computer 108 can update the "altitude" of the UAV 104 shown on the screens 102 appropriately.

The memory 502 can also include a UAV performance monitor 508. As mentioned above, the test computer 108 can monitor the performance of various components on the UAV 104 in response to various changes in hardware and/or software changes on the UAV 104. In some examples, the UAV performance monitor 508 can access a task manager, or similar, on the UAV 104 to monitor current processor 402, memory 420, communication bus 410, or other UAV 104 parameters. In other examples, instead or in addition to the task manager, the UAV performance monitor 508 can also utilize external performance measures. In some examples, the UAV performance monitor 508 can include a temperature sensor attached to the processor 402 of the UAV 104 to measure processor 402 utilization based on temperature.

In some implementations, the processor(s) 510 can comprise a central processing unit (CPU), a graphics processing unit (GPU), or both a CPU and a GPU, or any other sort of processing unit. The processor 510 can be responsible for running software on the test computer 108, including the aforementioned modules 504-508 and to interpret and send data to the screens 102 and UAV 104. In some examples, the processor(s) 510 can also perform calculations and provide instructions to the UAV 104 based on the various inputs 520.

The test computer 108 can also include additional data storage devices (removable and/or non-removable) such as, for example, magnetic disks, optical disks, or tape. Such additional storage is illustrated in FIG. 2B by removable storage 512 and non-removable storage 514. The removable storage 512 and non-removable storage 514 can store the various modules, programs, and algorithms for the navigation, landing, and advertising processes and can include routines for scheduling and canceling deliveries, among other things.

Non-transitory computer-readable media may include volatile and nonvolatile, removable and non-removable tangible, physical media implemented in technology for storage of information, such as computer readable instructions, data structures, program modules, or other data. The memory 502, removable storage 512, and non-removable storage 514 are all examples of non-transitory computer-readable media. Non-transitory computer-readable media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other tangible, physical medium which can be used to store the desired information and which can be accessed by the test computer 108. Any such non-transitory computer-readable media 420 may be part of the test computer 108 or may be a separate device (e.g., a jump drive) or a separate database or databank (e.g. at the test computer 108).

In some implementations, the transceivers 516 can include any sort of transceivers known in the art. For example, the transceivers 516 may include wired communication components, such as a wired modem or Ethernet port, for communicating with a LAN at the delivery location. Also, or instead, the transceivers 516 may include wireless modem(s) to facilitate wireless connectivity with the LAN, the test computer 108, the UAV 104, the Internet, and/or an intranet. Further, the transceivers 516 may include a radio transceiver that performs the function of transmitting and receiving radio frequency communications via an antenna (e.g., Wi-Fi or Bluetooth®).

In some implementations, the output devices 518 can include any sort of output devices known in the art, such as a display (e.g., an LCD, LED, or TFT screen), a touchscreen display, lights, speakers, a vibrating mechanism, or a tactile feedback mechanism to provide interactive feedback to the user 136 and/or the UAV 104. In some examples, the output devices 518 can play various sounds based, for example, on whether the landing area is safe to enter, the UAV 104 has landed, or if there is an object preventing the UAV 104 from landing. Output devices 518 also include ports for one or more peripheral devices, such as headphones, peripheral speakers, or a peripheral display.

In various implementations, input devices 520 can include any sort of input devices known in the art. For example, input devices 520 may include a camera, a microphone, a keyboard/keypad/touchpad, a touch-sensitive display, a proximity sensor, and a tilt sensor. A keyboard/keypad may be a standard push button alphanumeric, multi-key keyboard (such as a conventional QWERTY keyboard), a touchscreen keyboard, or one or more other types of keys or buttons, and may also include a joystick, wheel, and/or designated navigation buttons, or the like. In some examples, the input devices 520 can also include communication ports on the first computer 105*a* to enable at least one other computer 105 access such that it can restart applications or services and restart and/or reboot the first computer 105*a* (e.g., kernel level access).

Figure 6A:
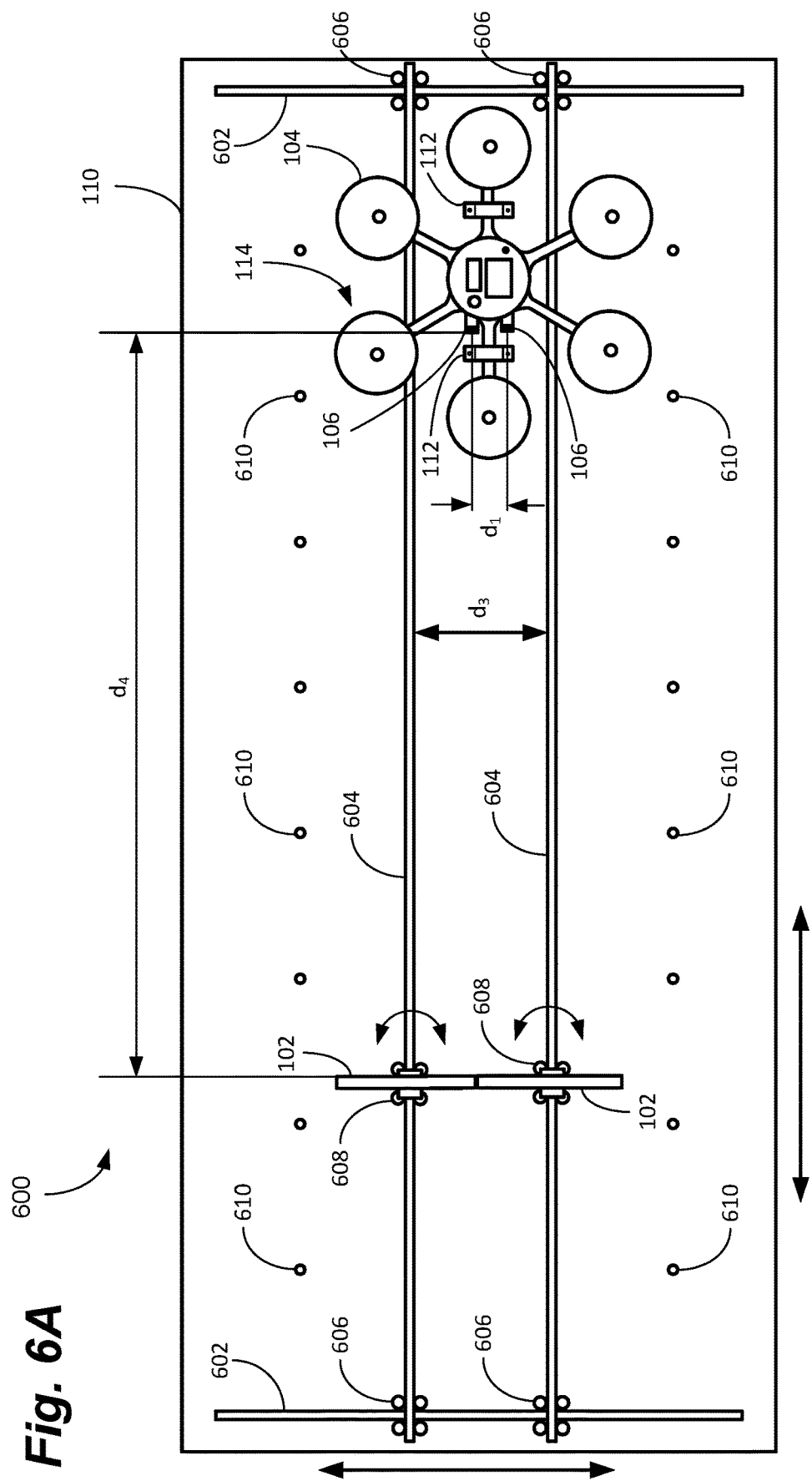
FIG. 6A is a schematic diagram that depicts a dual rail test rig, in accordance with some examples of the present disclosure.

As discussed above, the parallax angle seen by the stereoscopic cameras 106 is determined largely by their spacing, $d_1$. Thus, different sized vehicles may have their cameras 106 spaced differently due to differences in overall size, chassis design, space constraints, and other factors. As shown in FIG. 6A, therefore, examples of the present disclosure can also comprise an adjustable test rig 600 for testing multiple vehicles, including UAVs 104, with different sizes, shapes, and configurations. In some examples, the test rig 600 can comprise one or more lateral rails 602 and one or more longitudinal rails 604. The test rig 600 can also include a plurality of trucks 606 and mounts 608 to enable system components to be mounted and adjusted.

As shown, in some examples, the lateral rails 602 can be mounted to the test stand 110. In some examples, the lateral rails 602 can be permanently mounted to the test stand 110 using, for example, welds, adhesive, screws, bolts, nails, staples, or other suitable fastening means. In other examples, the test stand 110 can include multiple mounting holes 610 to enable the lateral rails 602 to be repositioned on the test stand 110.

The longitudinal rails 604, on the other hand, can be mounted to the lateral rails using a plurality of trucks 606 to enable the distance, $d_3$, between the longitudinal rails 604 to be adjusted according to the configuration of the vehicle being tested. In this manner, the distance between the screens 102 can be adjusted in proportion to the distance, $d_1$, between the cameras 106, as discussed above. The trucks 606 can include a plurality of wheels, rollers, bearings, slides, or other means to enable them to slide on the lateral rails 602. In some examples, the trucks 606 can be lockable to enable the position of the longitudinal rails 604 to be substantially fixed.

The test rig 600 can also include a plurality of mounts 608 to mount the screens 102 to the longitudinal rails 604. As with the trucks 606, the mounts 608 can include a plurality of wheels, rollers, bearings, slides, or other means to enable them to slide on the longitudinal rails 604. This can enable the distance, $d_4$, between the screens 102 and the cameras 106 to be adjusted.

In some examples, the mounts 608 can also enable the screens 102 to rotate to adjust the angle of the screens 102 relative to the cameras 106. As discussed above, it can be desirable to adjust the position of the screens 102 (i.e., their distance apart) based on, for example, the parallax angle, α, of the setup and to adjust the angle of the screens 102 relative to the cameras 106 based on the configuration of the cameras 106. In other words, if the cameras 106 are straight, then the screens 102 can be straight (i.e., perpendicular to the screens 102 and parallel to each other). If the screens 102 are toed-in or toed-out, on the other hand, then the screens 102 can be placed at the appropriate angle such that they are substantially perpendicular to the screens 102.

In some examples, the mounts 608 can detachably couple to the screens 102 to enable the screens 102 to be changed for different vehicles (e.g., UAVs 104). In other words, UAVs 104 of different sizes may require different sized screens 102. In addition, UAVs 104 with differently spaced cameras 106 or cameras 106 with, for example, different resolutions, focal lengths, or focusing ranges may require different sized screens 102 or screens with, for example, different resolutions, color palettes, or contrasts. In some examples, the screens 102 can be bolted or pinned, for example, to the mounts 608 to enable them to be easily removed and replaced.

Figure 6B:
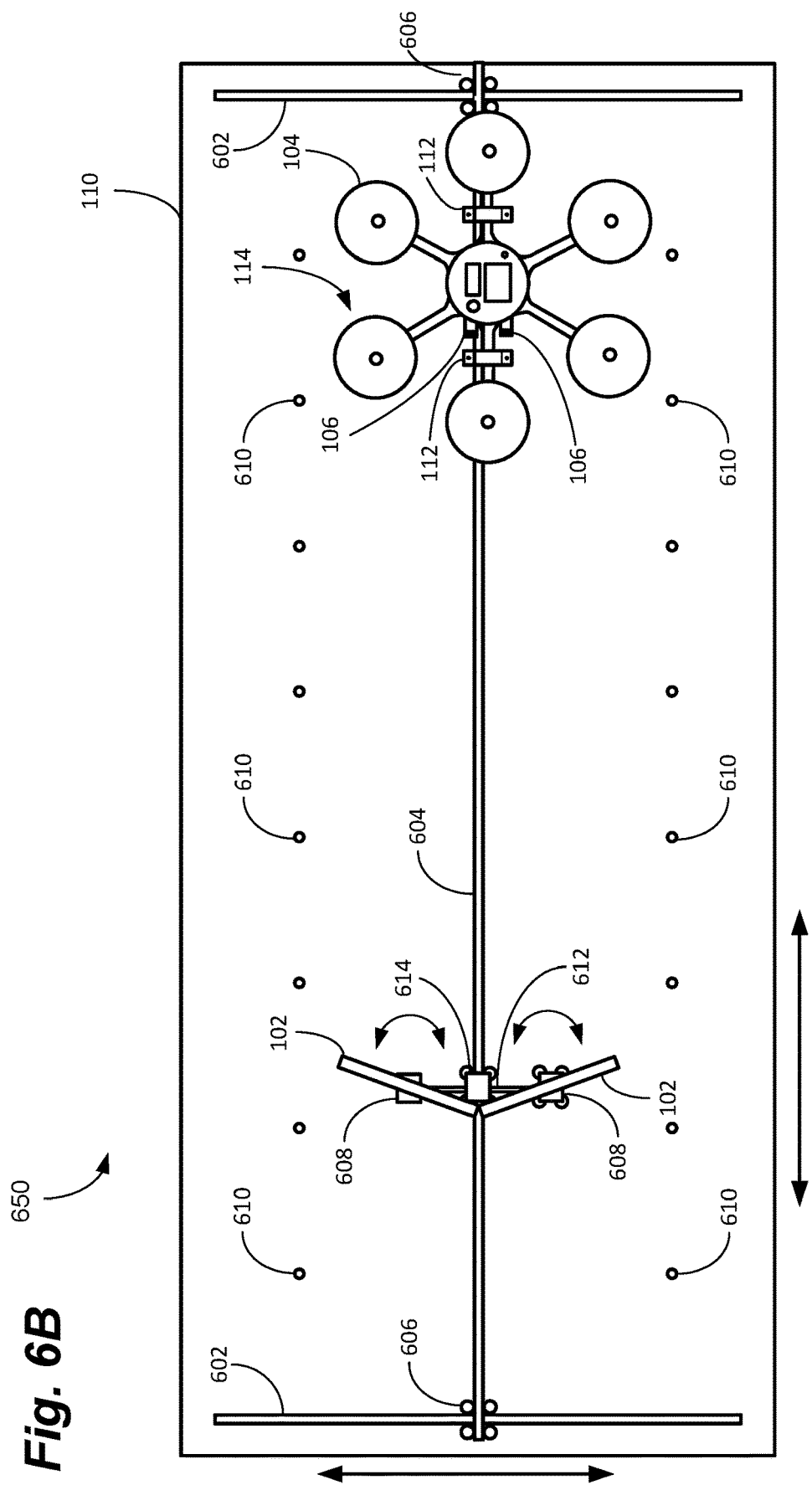
FIG. 6B is a schematic diagram that depicts a single rail test rig, in accordance with some examples of the present disclosure.

Of course, different configurations can be used. In some examples, as shown in FIG. 6B, the test rig 650 can comprise a single longitudinal rail 604. In this configuration, the screens 102 can be mounted on a tie bar 612 and central truck 614. The central truck 614 can enable both screens to be moved along the longitudinal rail 604. The mounts 608 for the screens 102 can then be mounted to the tie bar 612. In some examples, the mounts 608 can be slideably engaged with the tie bar 612 to enable the distance between the screens 102 to be adjusted. As before, the mounts 608 can enable the screens 102 to pivot to enable the screens 102 to be adjusted to the parallax angle, u, or other angles.

As shown in FIG. 7, in some examples the UAV 104 can include multiple cameras 106 to provide additional data for object detection and avoidance, navigation, and location identification, among other things. In this configuration, the system 700 can comprise multiple screens 102 to provide views for each camera 106. As shown, the UAV 104 can comprise a pair of stereoscopic cameras 106 pointing in four directions (I.e., front, rear, right, and left). In this configuration, the system 700 can provide the necessary views for each direction, with each pair of screens 102 providing the proper parallax for each pair of cameras 106.

In this case, the UAV 104 is shown with four pairs of straight stereoscopic cameras 106 (i.e., the cameras 106 in each pair are parallel to each other). As a result, the system 700 is shown with each pair of screens 102 perpendicular to the cameras 106 and parallel to each other. In addition, the cameras 106 are disposed around the UAV 104, such that each pair of screens 102 is configured for each pair of cameras 106. Of course, the UAV 104 could have more or less cameras 106 resulting in different configurations. If the UAV 104 included additional cameras 106, including cameras 106 pointing up and down, for example, the system 700 can begin to resemble a sphere of screens 102 for each camera 106 direction.

Figure 8:
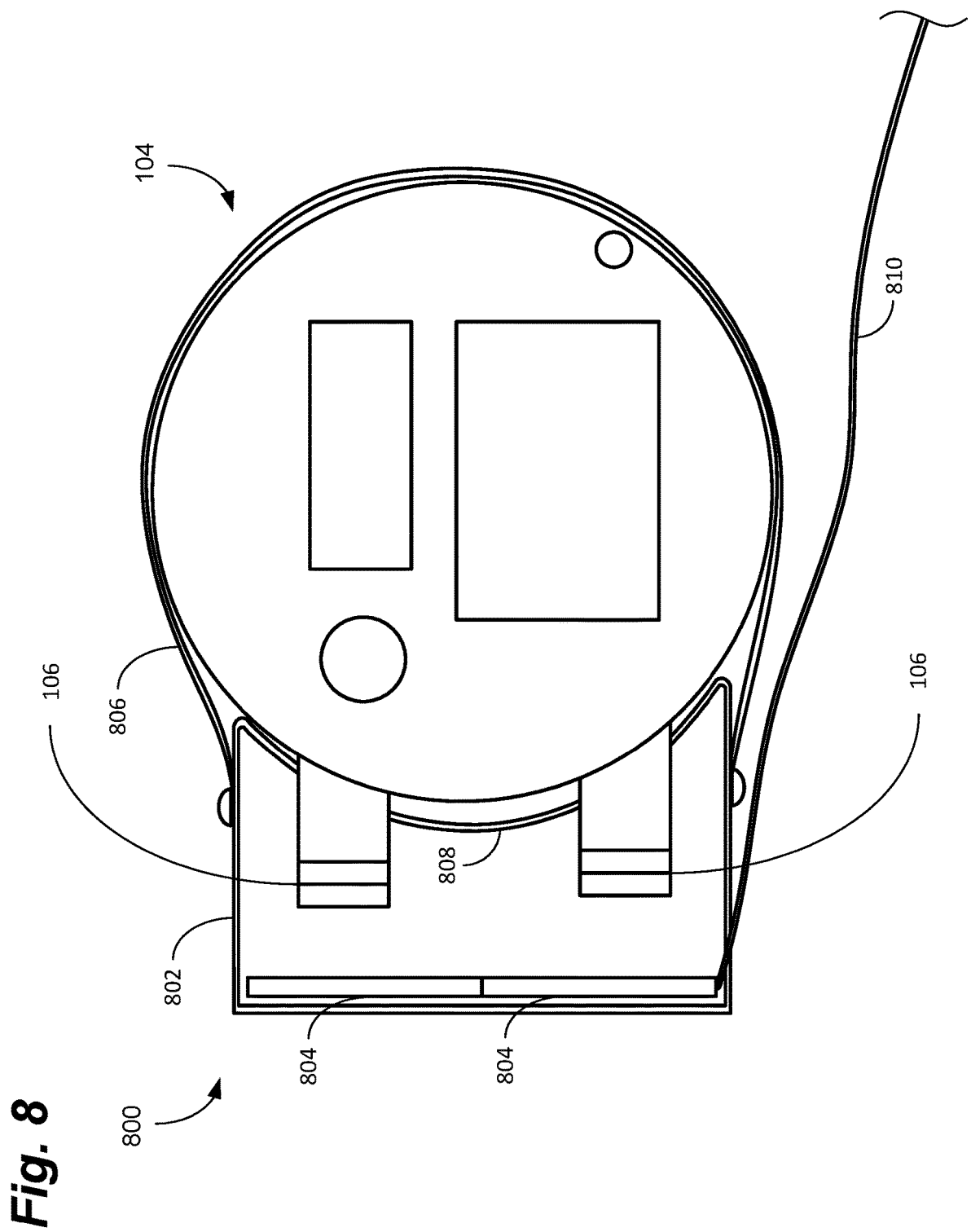
FIG. 8 is a schematic diagram that depicts a housing for mounting the cameras to the UAV, in accordance with some examples of the present disclosure.

As shown in FIG. 8, in some examples, the system 800 can be similar to virtual reality (VR) goggles. In this configuration, the system 800 can include a housing 802 that can be mounted directly on the cameras 106. The housing can include, for example, one or more screens 804 disposed inside the housing. In some examples, as shown, the system 800 can include two screens 804, one for each camera 106. In other examples, the system 800 can include a single screen 804 with a split screen feature to provide different images to each camera 106.

The system 800 can also include a retainer 806 to affix the housing 802 to the UAV 104. In some examples, the retainer 806 may be as simple as an adjustable elastic strap. In other examples, the retainer 806 can include snaps, buttons, magnets, or other means to temporarily attach the housing 802 to the UAV 104. In other examples, the housing 802 can include a gasket, or bellows 808. The bellows 808 can substantially prevent outside light from entering the housing 802, such that the light detected by the cameras 106 is substantially limited to the light produced by the screens 804.

In some examples, rather than using the retainer 806, the bellows 808 can be used to affix the system 800 to the cameras 106. In other words, the bellows 808 can form a tight, flexible seal around the cameras 106 and/or the body of the UAV 104 to hold the system 800 on the UAV 104 and in front of the cameras 106.

In some examples, the system 800 and camera 106 configuration can be standardized, such that the housing 802 is configured to fit a single camera 106 platform. In other examples, multiple housings 802 and screens 804 can be used for each camera 106 configuration. In other examples, the housing 802 can include clamps, bolts, or other means to enable the system 800 to be attached to multiple UAVs 104. In this manner, the system 800 is fully configurable for many types of UAVs 104 and cameras 106. In some examples, the housing 802 can also include one or more adjustments to enable the width and/or height of the housing to be adjusted for different UAV 104, or camera 106, configurations. In some examples, the system 800 can enable the cameras 106 to be tested independently of the UAVs 104. In other words, the system 800 can be used to test the cameras 106 outputs, accuracy, and other parameters using a simulated world and a simulated UAV 104.

The system 800 can also include a data cable 810 to provide data to the screens 804 from the test computer 108. As discussed above, the data can include an image for each screen 102 (or each half of the screen 102 in a split screen configuration) offset by a parallax angle.

While several possible examples are disclosed above, examples of the present disclosure are not so limited. For instance, while systems and methods for simulating flight for UAVs 104 has been disclosed, other devices can be tested, for example, without departing from the spirit of the disclosure. In addition, the location and configuration used for various features of examples of the present disclosure such as, for example, the order of steps, the components of the test environment 100 or the UAV 104, and the materials used can be varied according to a particular UAV 104, vehicle, computer network or other component that requires a slight variation due to, for example, the size or construction of the UAV 104, the size of the screens 102, or the processing power of the UAV 104 or test computer 108. Such changes are intended to be embraced within the scope of this disclosure.

The specific configurations, choice of materials, and the size and shape of various elements can be varied according to particular design specifications or constraints requiring a device, system, or method constructed according to the principles of this disclosure. Such changes are intended to be embraced within the scope of this disclosure. The presently disclosed examples, therefore, are considered in all respects to be illustrative and not restrictive. The scope of the disclosure is indicated by the appended claims, rather than the foregoing description, and all changes that come within the meaning and range of equivalents thereof are intended to be embraced therein.

What is claimed is:

1. A system comprising:
   an unmanned aerial vehicle (UAV);
   a test stand, with a substantially horizontal, planar upper surface, configured to secure the UAV in a stationary position;
   screens, attached to respective mounts, disposed at a predetermined angle and a predetermined distance from the UAV; and
   a test computer in electronic communication with the screens and the UAV, the test computer including one or more processors and non-transitory computer-readable media storing instructions that, when executed by the one or more processors, cause the one or more processors to perform operations during a simulated flight of the UAV comprising:
      receiving control inputs from the UAV secured to the test stand;
      determining a first group of images representing a first perspective from the UAV during the simulated flight for a first screen of the screens based at least in part on the control inputs;
      determining a second group of images representing a second perspective from the UAV during the simulated flight for a second screen of the screens based at least in part on the control inputs, wherein the predetermined angle and predetermined distance are determined based at least in part on a parallax angle for a pair of cameras on the UAV; and
      causing simultaneous display of the determined first group of images on the first screen and display of the determined second group of images on the second screen, each display at the predetermined angle and distance.

2. The system of claim 1, wherein:
   determining the first group of images comprises determining the first group of images based at least in part on a current simulated velocity and a travel direction of the UAV; and
   determining the second group of images comprises determining the second group of images based at least in part on the current simulated velocity and the travel direction of the UAV.

3. The system of claim 1, wherein the control inputs comprise one or more commanded flight control inputs from a flight controller of the UAV intended to change a power setting, a pitch, a roll, or a yaw of the UAV.

4. The system of claim 1, the operations further comprising receiving one or more usage statistics from the UAV comprising a current utilization rate for at least one of the one or more processors, memory, or a communications bus of the UAV.

5. The system of claim 1, the test stand further comprising: two lateral rails coupled to the upper surface; two longitudinal rails slidably coupled to the two lateral rails and repositionable along the two lateral rails; and the respective mounts slidably coupled to the two longitudinal rails and repositionable along the two longitudinal rails to adjustably secure the screens to the test stand.

6. The system of claim 1, wherein: the screens have a higher resolution than the two cameras on the UAV.

7. The system of claim 1, further comprising: a housing detachably coupleable to the UAV in an overlying manner to the one or more cameras on the UAV; and wherein the screens are disposed inside the housing.

8. The system of claim 7, wherein the housing further comprises a bellows configured to form a tight, flexible seal around the one or more cameras and to detachably couple the housing to the UAV.

9. A method comprising:
   providing screens attached to respective mounts at a predetermined angle and a predetermined distance from an unmanned aerial vehicle (UAV) secured to a test stand in a stationary position based at least in part on a parallax angle for a pair of cameras on the UAV by adjusting angle and position of each mount;
   providing a test computer in electronic communication with the screens and the UAV, the test computer including one or more processors and non-transitory computer-readable media storing instructions;
   receiving, by the one or more processors during a simulated flight of the UAV, control inputs from the UAV;
   determining, by the one or more processors, a first group of images representing a first perspective from the UAV during the simulated flight for a first screen of the screens based at least in part on the control inputs;
   determining, by the one or more processors during a simulated flight of the UAV, a second group of images representing a second perspective from the UAV during the simulated flight for a second screen of the screens based at least in part on the control inputs; and
   causing, by the one or more processors during a simulated flight of the UAV, simultaneous display of the determined first group of images on the first screen and display of the determined second group of images on the second screen.

10. The method of claim 9, wherein:
    determining the first group of images comprises determining the first group of images based at least in part on a current simulated velocity and a travel direction of the UAV; and
    determining the second group of images comprises determining the second group of images based at least in part on the current simulated velocity and the travel direction of the UAV.

11. The method of claim 9, wherein the control inputs comprise one or more commanded flight control inputs from a flight controller of the UAV intended to change at least one of a power setting, a pitch, a roll, or a yaw of the UAV.

12. The method of claim 9, further comprising receiving one or more usage statistics from the UAV, the one or more usage statistics including a current utilization rate for one or more of a processor, a memory, or a communications bus of the UAV.

13. The method of claim 9, further comprising sending navigational data from the test computer to the UAV.

14. The method of claim 9, wherein the parallax angle is based at least in part on a distance between the two cameras on the UAV.

15. The method of claim 9, further comprising receiving one or more usage statistics from the UAV, the one or more usage statistics comprising receiving a current battery life for a battery on the UAV.

* * * * *